US007611616B2

(12) United States Patent
Cohen et al.

(10) Patent No.: US 7,611,616 B2
(45) Date of Patent: Nov. 3, 2009

(54) MESOSCALE AND MICROSCALE DEVICE FABRICATION METHODS USING SPLIT STRUCTURES AND ALIGNMENT ELEMENTS

(75) Inventors: Adam L. Cohen, Van Nuys, CA (US); Michael S. Lockard, Lake Elizabeth, CA (US); Dennis R. Smalley, Newhall, CA (US)

(73) Assignee: Microfabrica Inc., Van Nuys, CA (US)

( * ) Notice: Subject to any disclaimer, the term of this patent is extended or adjusted under 35 U.S.C. 154(b) by 641 days.

(21) Appl. No.: 11/506,586

(22) Filed: Aug. 18, 2006

(65) Prior Publication Data

US 2007/0039828 A1   Feb. 22, 2007

Related U.S. Application Data

(63) Continuation-in-part of application No. 11/435,809, filed on May 16, 2006, and a continuation-in-part of application No. 10/677,556, filed on Oct. 1, 2003, now abandoned, said application No. 11/435,809 is a continuation-in-part of application No. 10/434,103, filed on May 7, 2003, now Pat. No. 7,160,429.

(60) Provisional application No. 60/709,614, filed on Aug. 19, 2005, provisional application No. 60/681,788, filed on May 16, 2005, provisional application No. 60/379,182, filed on May 7, 2002, provisional application No. 60/430,809, filed on Dec. 3, 2002, provisional application No. 60/415,374, filed on Oct. 1, 2002.

(51) Int. Cl.
*C25D 5/02* (2006.01)

(52) U.S. Cl. .................................... 205/118; 205/223

(58) Field of Classification Search ................. 205/118, 205/122, 170, 181, 182, 223
See application file for complete search history.

(56) References Cited

U.S. PATENT DOCUMENTS

| 5,190,637 | A | 3/1993 | Guckel ............... 205/118 |
| 6,027,630 | A | 2/2000 | Cohen ............... 205/135 |
| 7,250,101 | B2 | 7/2007 | Thompson et al. ........ 205/67 |
| 2005/0067292 | A1 | 3/2005 | Thompson et al. ........ 205/118 |

(Continued)

OTHER PUBLICATIONS

Cohen, et al., "EFAB: Batch Production of Functional, Fully-Dense Metal Parts with Micron-Scale Features", Proc. 9th Solid Freeform Fabrication, The University of Texas at Austin, Aug. 1998, pp. 161.

(Continued)

*Primary Examiner*—Nam X Nguyen
*Assistant Examiner*—Luan V Van
(74) *Attorney, Agent, or Firm*—Dennis R. Smalley

(57) ABSTRACT

Various embodiments of the invention are directed to formation of mesoscale or microscale devices using electrochemical fabrication techniques where structures are formed from a plurality of layers as opened structures which can be folded over or other otherwise combined to form structures of desired configuration. Each layer is formed from at least one structural material and at least one sacrificial material. The initial formation of open structures may facilitate release of the sacrificial material, ability to form fewer layers to complete a structure, ability to locate additional materials into the structure, ability to perform additional processing operations on regions exposed while the structure is open, and/or the ability to form completely encapsulated and possibly hollow structures.

18 Claims, 13 Drawing Sheets

U.S. PATENT DOCUMENTS

2005/0142739 A1    6/2005    Kumar et al. ............... 438/254
2006/0108678 A1    5/2006    Kumar et al. ............... 257/690

OTHER PUBLICATIONS

Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 17-21, 1999, pp. 244-251.

"Microfabrication—Rapid Prototyping's Killer Application", Rapid Prototyping Report, CAD/CAM Publishing, Inc., Jun. 1999, pp. 1-5.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999.

Adam L. Cohen, "Electrochemical Fabrication (EFABTM)", Chapter 19 of the MEMS Handbook, edited by Mohamed Gad-El-Hak, CRC Press, 2002, pp. 19/1-19/23.

MESOSCALE AND MICROSCALE DEVICE FABRICATION METHODS USING SPLIT STRUCTURES AND ALIGNMENT ELEMENTS

RELATED APPLICATIONS

This application claims benefit of U.S. Provisional Patent Application No. 60/709,614, filed Aug. 19, 2005, is a continuation-in-part of U.S. patent application Ser. Nos. 11/435,809 and 10/677,556, respectively filed on May 16, 2006 and Oct. 1, 2003; the '809 application in turn claims benefit of 60/681,788, filed May 16, 2005 and is a continuation-in-part of Ser. No. 10/434,103, filed on May 7, 2003 now U.S. Pat. No. 7,160,429 which in turn claims benefit of 60/379,182, filed on May 7, 2002, and 60/430,809, filed December 3, 2002; the '556 application in turn claims benefit of 60/415,374, filed Oct. 1, 2002. Each of the above noted applications is hereby incorporated herein by reference as if set forth in full.

FIELD OF THE INVENTION

This application relates to the electrochemical fabrication of multi-layer micro-scale and meso-scale devices. It more particularly relates to forming such devices from at least one structural material where the structure of the device is split into a plurality of at least partially separated portions and wherein the separated portions are brought into contact after release of at least one structural material from at least one sacrificial material that is used during the formation of a plurality of layers from which the structure is formed.

BACKGROUND OF THE INVENTION

A technique for forming three-dimensional structures (e.g. parts, components, devices, and the like) from a plurality of adhered layers was invented by Adam L. Cohen and is known as Electrochemical Fabrication. It is being commercially pursued by Microfabrica Inc. (formerly MEMGen® Corporation) of Van Nuys, Calif. under the name EFAB®. This technique was described in U.S. Pat. No. 6,027,630, issued on Feb. 22, 2000. This electrochemical deposition technique allows the selective deposition of a material using a unique masking technique that involves the use of a mask that includes patterned conformable material on a support structure that is independent of the substrate onto which plating will occur. When desiring to perform an electrodeposition using the mask, the conformable portion of the mask is brought into contact with a substrate while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica Inc. (formerly MEMGen® Corporation) of Van Nuys, Calif. such masks have come to be known as INSTANT MASKS™ and the process known as INSTANT MASKING™ or INSTANT MASK plating. Selective depositions using conformable contact mask plating may be used to form single layers of material or may be used to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

1. A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p 161, August 1998.
2. A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p 244, January 1999.
3. A. Cohen, "3-D Micromachining by Electrochemical Fabrication", Micromachine Devices, March 1999.
4. G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroN\anotechnology for Space Applications, The Aerospace Co., April 1999.
5. F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.
6. A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.
7. F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.
8. A. Cohen, "Electrochemical Fabrication (EFAB™)", Chapter 19 of The MEMS Handbook, edited by Mohamed Gad-EI-Hak, CRC Press, 2002.
9. Microfabrication—Rapid Prototyping's Killer Application", pages 1-5 of the Rapid Prototyping Report, CAD/CAM Publishing, Inc., June 1999.

The disclosures of these nine publications are hereby incorporated herein by reference as if set forth in full herein.

The electrochemical deposition process may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate.
2. Then, blanket depositing at least one additional material by electrodeposition so that the additional deposit covers both the regions that were previously selectively deposited onto, and the regions of the substrate that did not receive any previously applied selective depositions.
3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to the immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed.

The preferred method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated. At least one CC mask is needed for each unique cross-sectional pattern that is to be plated.

The support for a CC mask is typically a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of the substrate (or onto a previously formed layer or onto a previously deposited portion of a layer) on which deposition is to occur. The pressing together of the CC mask and substrate occur in such a way that all openings, in the conformable portions of the CC mask contain plating solution. The conformable material of the CC mask that contacts the substrate acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A-1C. FIG. 1A shows a side view of a CC mask 8 consisting of a conformable or deformable (e.g. elastomeric) insulator 10 patterned on an anode 12. The anode has two functions. One is as a supporting material for the patterned insulator 10 to maintain its integrity and alignment since the pattern may be topologically complex (e.g., involving isolated "islands" of insulator material). The other function is as an anode for the electroplating operation. FIG. 1A also depicts a substrate 6 separated from mask 8. CC mask plating selectively deposits material 22 onto a substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 1C. The CC mask plating process is distinct from a "through-mask" plating process in that in a through-mask plating process the separation of the masking material from the substrate would occur destructively. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating, as individual masks are not intentionally destroyed in the removal process, they may be usable in multiple plating operations.

Another example of a CC mask and CC mask plating is shown in FIGS. 1D-1G. FIG. 1D shows an anode 12' separated from a mask 8' that includes a patterned conformable material 10' and a support structure 20. FIG. 1D also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the fabrication of the substrate on which plating is to occur (e.g. separate from a three-dimensional (3D) structure that is being formed). CC masks may be formed in a variety of ways, for example, a photolithographic process may be used. All masks can be generated simultaneously prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A-2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A, illustrates that the passing of current causes material 2 within the plating solution and material 2 from the anode 12 to be selectively transferred to and plated on the substrate 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A-3C. The system 32 consists of several subsystems 34, 36, 38, and 40. The substrate holding subsystem 34 is depicted in the upper portions of each of FIGS. 3A-3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source (not shown) for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which feet 68 of subsystem 34 may sit. Subsystem 38 also includes appropriate electrical connections (not shown) for connecting the anode to an appropriate power supply (not shown) for driving the blanket deposition process.

The planarization subsystem 40 is shown in the lower portion of FIG. 3C and includes a lapping plate 52 and associated motion and control systems (not shown) for planarizing the depositions.

The '630 patent further indicates that the electroplating methods and articles disclosed therein allow fabrication of devices from thin layers of materials such as, e.g., metals, polymers, ceramics, and semiconductor materials. It further indicates that although the electroplating embodiments described therein have been described with respect to the use of two metals, a variety of materials, e.g., polymers, ceramics and semiconductor materials, and any number of metals can be deposited either by the electroplating methods therein, or in separate processes that occur throughout the electroplating method. It indicates that a thin plating base can be deposited, e.g., by sputtering, over a deposit that is insufficiently conductive (e.g., an insulating layer) so as to enable subsequent electroplating. It also indicates that multiple support materials (i.e. sacrificial materials) can be included in the electroplated element allowing selective removal of the support materials.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal layers". This patent teaches the formation of metal structure utilizing mask exposures. A first layer of a primary metal is electroplated onto an exposed plating base to fill a void in a photoresist, the photoresist is then removed and a secondary metal is electroplated over the first layer and over the plating base. The exposed surface of the secondary metal is then machined down to a height which exposes the first metal to produce a flat uniform surface extending across the both the primary and secondary metals. Formation of a second layer may then begin by applying a photoresist layer over the first layer and then repeating the process used to produce the first layer. The process is then repeated until the entire structure is formed and the secondary metal is removed by etching. The photoresist is formed over the plating base or previous layer by casting and the voids in the photoresist are formed by exposure of the photoresist through a patterned mask via X-rays or UV radiation.

Electrochemical fabrication provides the ability to form prototypes and commercial quantities of miniature objects, parts, structures, devices, and the like at reasonable costs and in reasonable times. In fact, electrochemical fabrication is an enabler for the formation of many structures that were hitherto impossible to produce. Electrochemical fabrication opens the spectrum for new designs and products in many industrial fields. Even though electrochemical fabrication offers this new capability and it is understood that electrochemical fabrication techniques can be combined with designs and structures known within various fields to produce new structures, certain uses for electrochemical fabrication provide designs, structures, capabilities and/or features not known or obvious in view of the state of the art.

Release of structural material from sacrificial material may be difficult or excessively time consuming, or even impossible, if the sacrificial material is located within or at the ends of narrow, long or complex passages or if the sacrificial material is completely encapsulated by structural material.

It may be difficult to incorporate all desired materials into a structure during layer-by-layer build up (e.g. for example if the material is not compatible with selected processes used in the layer-by-layer fabrication or if the added materials would excessively complicate the process) and as such improved methods of incorporating select materials after layer-by-layer fabrication are desirable.

A need exists for improved methods of electrochemically fabricating micro-scale and meso-scale structures or devices so as to (1) decrease the separation time of structural material from sacrificial material, (2) decrease the damage that may result from the separation process, (3) improve the extent of separation that can be achieved, and/or (4) enhance the ability to work with additional materials or processes so as to achieve enhanced structure or device characteristics.

SUMMARY OF THE INVENTION

It is an object of some embodiments of the invention to provide improved methods of electrochemically fabricating micro-scale and meso-scale structures or devices so as to decrease the separation time of structural and sacrificial material.

It is an object of some embodiments of the invention to provide improved methods of electrochemically fabricating micro-scale and meso-scale structures or devices so as to decrease the damage that may result from the separation process.

It is an object of some embodiments of the invention to provide improved methods of electrochemically fabricating micro-scale and meso-scale structures or devices so as to improve the extent of separation that can be achieved It is an object of some embodiments of the invention to provide improved methods of electrochemically fabricating micro-scale and meso-scale structures or devices so as to enhance the ability to work with additional materials or processes so as to achieve enhanced structure or device characteristics.

Other objects and advantages of various embodiments and aspects of the invention will be apparent to those of skill in the art upon review of the teachings herein. The various embodiments of the invention, set forth explicitly herein or otherwise ascertained from the teachings herein, may address one or more of the above objects alone or in combination, or alternatively may address some other object of the invention ascertained from the teachings herein. It is not necessarily intended that all objects be addressed by any single embodiment or aspect of the invention even though that may be the case with regard to some embodiments or aspects.

In a first aspect of the invention a method for forming at least a portion of a three-dimensional device having a desired configuration, includes: (a) forming at least first and second portions of a structure from a plurality of adhered layers of at least one structural material where the first portion has a first surface and the second portion has a second surface where the first and second surfaces are separated from one another during formation of the layers but which are to be located in contact or in proximity to one another in the desired configuration; (b) separating the structure from any sacrificial material that would hinder the bringing of the first and second portions into contact or into proximity or which would be effectively trapped if in place when the first and second portions are brought together; and (c) moving at least one of the first and second portions relative to the other to bring the first and second surfaces into contact or into proximity to yield the three-dimensional device, wherein the forming comprises depositing at least one of the at least one structural material or the sacrificial material selectively onto a substrate or previously deposited material via one or more openings in a masking material that is adhered to the substrate or previously deposited material.

In a second aspect of the invention a method for forming at least a portion of a three-dimensional device having a desired configuration, includes: (a) forming at least first and second portions of a structure from a plurality of adhered layers of at least one structural material where the first portion has a first surface and the second portion has a second surface where the first and second surfaces are separated from one another during formation of the layers but which are to be located in contact or in proximity to one another in the desired configuration; and (b) moving at least one of the first and second portions relative to the other to bring the first and second surfaces into contact or into proximity, wherein the forming comprises depositing at least one material selectively onto a substrate or previously deposited material via one or more openings in a masking material that is adhered to the substrate or previously deposited material.

In a third aspect of the invention a method for forming at least a portion of a three-dimensional device having a desired configuration, includes: (a) forming at least first and second portions of a structure from a plurality of adhered layers of at least one structural material where the first portion has a first surface and the second portion has a second surface where the first and second surfaces are separated from one another during formation of the layers but which are to be located in contact or in proximity to one another in the desired configuration; and (b) moving at least one of the first and second portions relative to the other to bring the first and second surfaces into contact or into proximity, wherein at least one of the first portion or the second portion includes alignment structures which aid in guiding the first and second surfaces in proximity or in contact.

In a fourth aspect of the invention a method for forming at least a portion of a three-dimensional device having a desired configuration, includes: (a) forming at least first and second portions of a structure from a plurality of adhered layers of at least one structural material where the first portion has a first surface and the second portion has a second surface where the first and second surfaces are separated from one another during formation of the layers but which are to be located in contact or in proximity to one another in the desired configuration; and (b) moving at least one of the first and second portions relative to the other to bring the first and second surfaces into contact or into proximity, wherein at least one of the first portion or the second portion includes alignment structures which aid in ensuring that the first and second portions are properly located after moving.

In a fifth aspect of the invention a method for forming at least a portion of a three-dimensional device having a desired configuration, includes: (a) forming at least first and second portions of a structure from a plurality of adhered layers of at least one structural material where the first portion has a first surface and the second portion has a second surface where the first and second surfaces are separated from one another during formation of the layers but which are to be located in contact or in proximity to one another in the desired configuration; and (b) moving at least one of the first and second portions relative to the other to bring the first and second surfaces into contact or into proximity, wherein the forming comprises forming one or more alignment structures which aid in locating the first and second surfaces in proximity or in contact and/or which aid in guiding the first and second surfaces in proximity or in contact.

In a sixth aspect of the invention a method for forming at least a portion of a three-dimensional device having a desired configuration, includes: (a) forming at least first, second, and third portions of a structure from a plurality of adhered layers of at least one structural material where the first portion has a first surface and the second portion has a second surface and the third portion has a third surface, where the first, second, surfaces are separated from one another during formation of the layers but which are to be located in contact or in proximity to one another in the desired configuration, and where the third surface is separated from the first and second portions during formation but is to be located in contact or in proximity to a surface of one of the first or second portions; (b) moving at least one of the first and second portions relative to the other to bring the first and second surfaces into contact or into proximity, and (c) moving at least one of the third or combined first and second portions relative to the other to bring the third and combined first and second portions into contact or into proximity.

Further aspects of the invention will be understood by those of skill in the art upon review of the teachings herein. Other aspects of the invention may involve apparatus that can be used in implementing one or more of the above method aspects of the invention. Other aspects may involve combinations of the elements set forth explicitly herein with elements set forth in one or more of the applications or other publications incorporated herein by reference. These other aspects of the invention may provide various combinations of the aspects, embodiments, and associated alternatives explicitly set forth herein as well as provide other configurations,

DETAILED DESCRIPTION OF PREFERRED EMBODIMENTS OF THE INVENTION

FIGS. 1A-1G, 2A-2F, and 3A-3C illustrate various features of one form of electrochemical fabrication. Other electrochemical fabrication techniques are set forth in the '630 patent referenced above, in the various previously incorporated publications, in various other patents and patent applications incorporated herein by reference. Still others may be derived from combinations of various approaches described in these publications, patents, and applications, or are otherwise known or ascertainable by those of skill in the art from the teachings set forth herein. All of these techniques may be combined with those of the various embodiments of various aspects of the invention to yield enhanced embodiments. Still other embodiments may be derived from combinations of the various embodiments explicitly set forth herein.

Figure 1A:
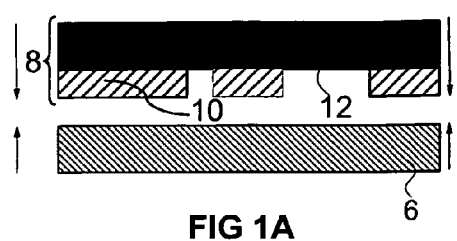
FIGS. 1A-1C schematically depict side views of various stages of a CC mask plating process, while FIGS. 1D-1G schematically depict a side views of various stages of a CC mask plating process using a different type of CC mask.
Figure 1B:
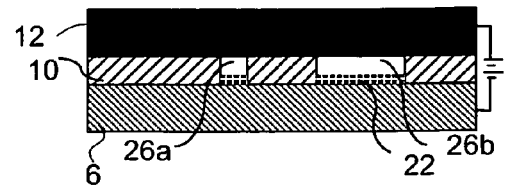
Figure 1C:
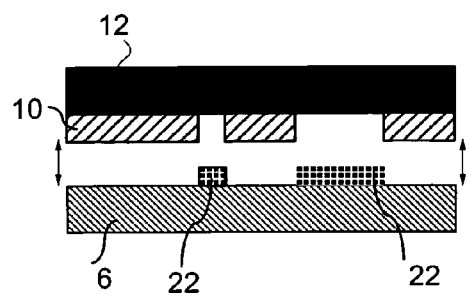
Figure 1D:
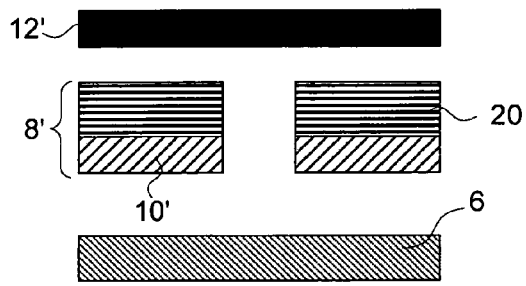
Figure 1E:
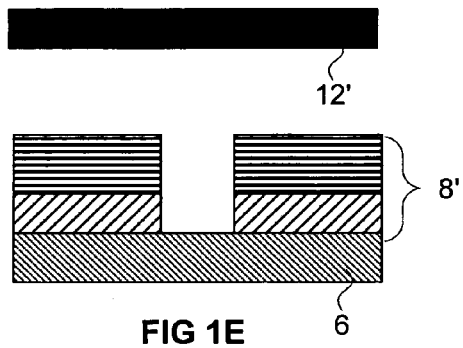
Figure 1F:
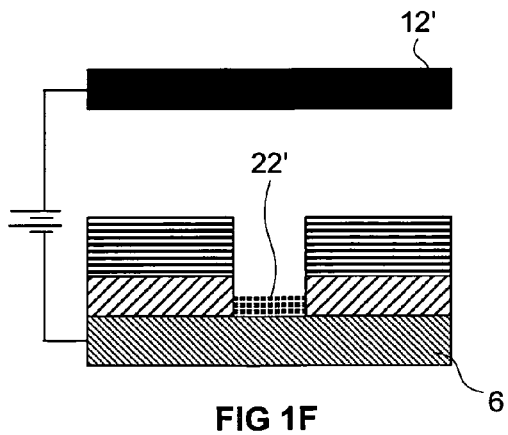
Figure 1G:
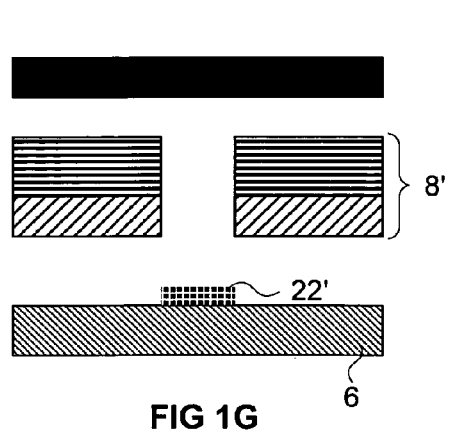
Figure 2A:
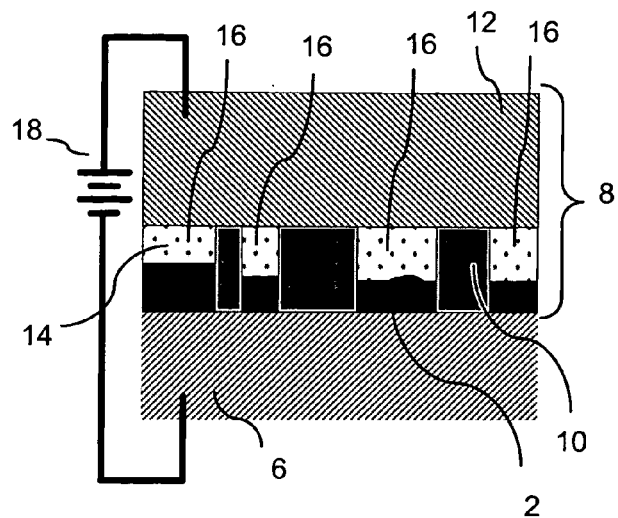
FIGS. 2A-2F schematically depict side views of various stages of an electrochemical fabrication process as applied to the formation of a particular structure where a sacrificial material is selectively deposited while a structural material is blanket deposited.
Figure 2B:
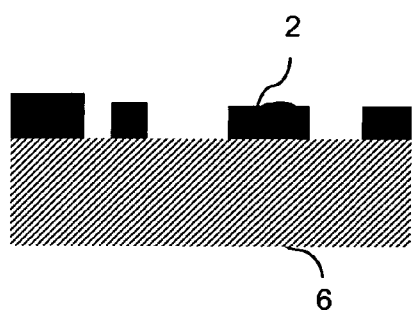
Figure 2C:
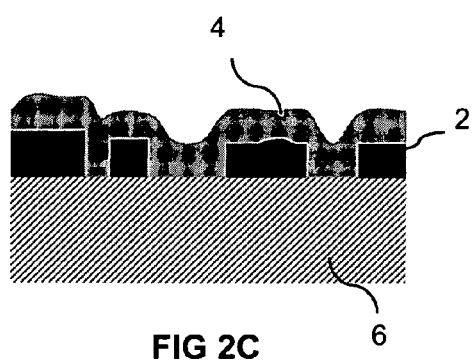
Figure 2D:
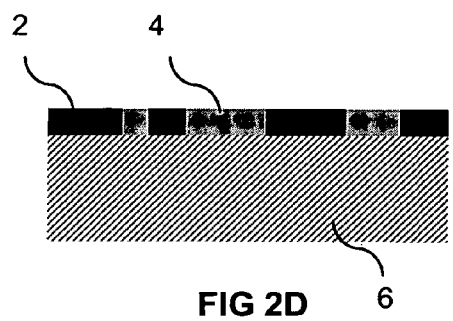
Figure 2E:
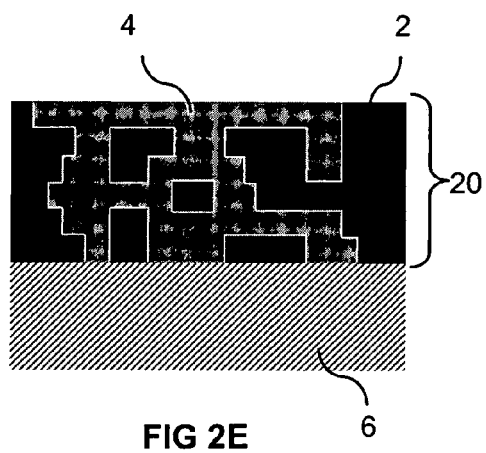
Figure 2F:
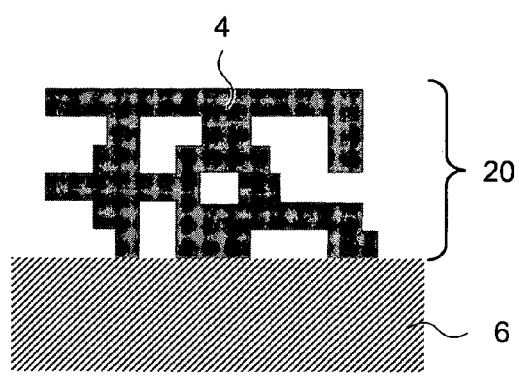
Figure 3A:
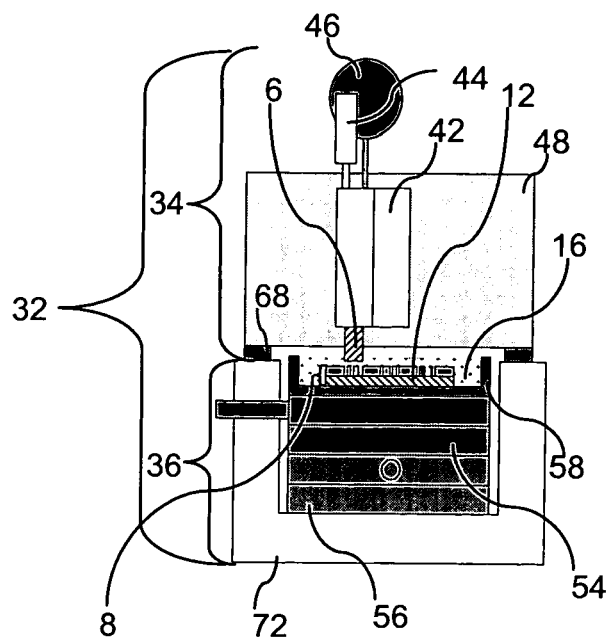
FIGS. 3A-3C schematically depict side views of various example apparatus subassemblies that may be used in manually implementing the electrochemical fabrication method depicted in FIGS. 2A-2F.
Figure 3B:
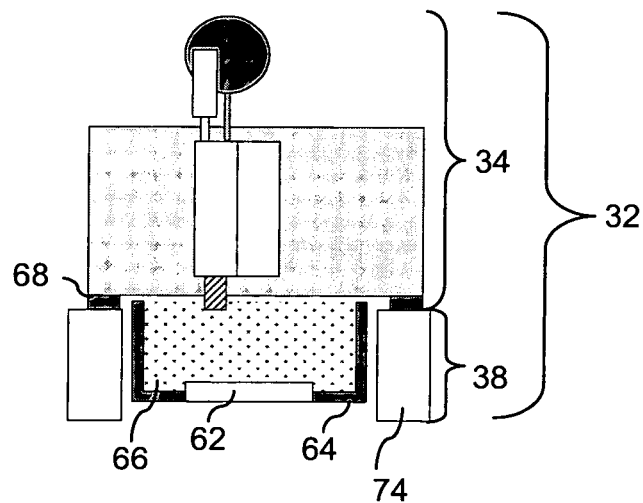
Figure 3C:
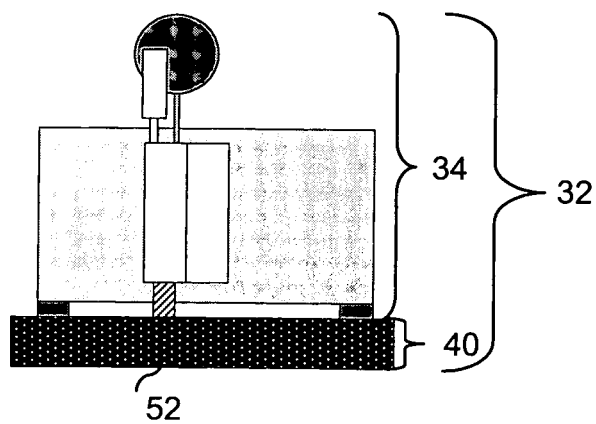
Figure 4A:
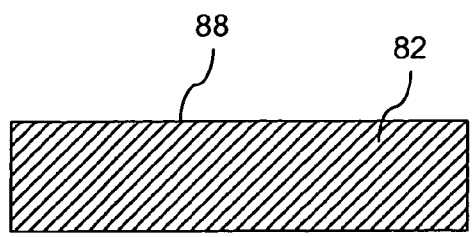
FIGS. 4A-4F schematically depict the formation of a first layer of a structure using adhered mask plating where the blanket deposition of a second material overlays both the openings between deposition locations of a first material and the first material itself
Figure 4B:
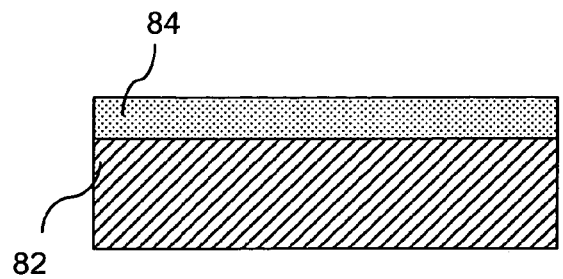
Figure 4C:
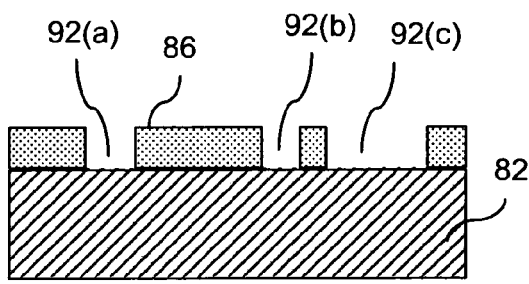
Figure 4D:
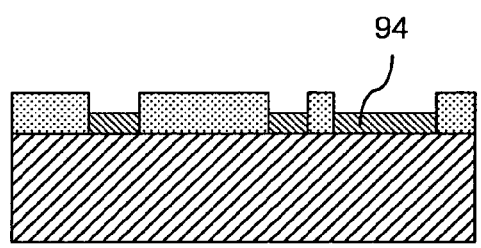
Figure 4E:
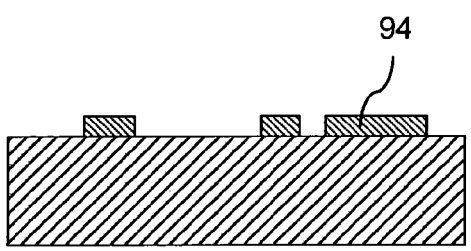
Figure 4F:
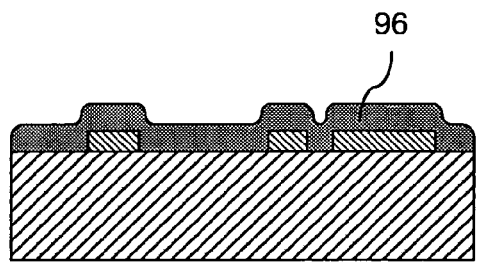
Figure 4G:
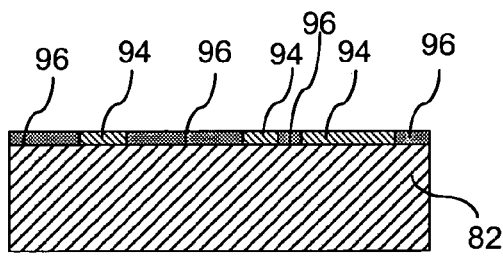
FIG. 4G depicts the completion of formation of the first layer resulting from planarizing the deposited materials to a desired level.

FIGS. 4A-4G illustrate various stages in the formation of a single layer of a multi-layer fabrication process where a second metal is deposited on a first metal as well as in openings in the first metal where its deposition forms part of the layer. In FIG. 4A, a side view of a substrate 82 is shown, onto which patternable photoresist 84 is cast as shown in FIG. 4B. In FIG. 4C, a pattern of resist is shown that results from the curing, exposing, and developing of the resist. The patterning of the photoresist 84 results in openings or apertures 92(a)-92(c) extending from a surface 86 of the photoresist through the thickness of the photoresist to surface 88 of the substrate 82. In FIG. 4D, a metal 94 (e.g. nickel) is shown as having been electroplated into the openings 92(a)-92(c). In FIG. 4E, the photoresist has been removed (i.e. chemically stripped) from the substrate to expose regions of the substrate 82 which are not covered with the first metal 94. In FIG. 4F, a second metal 96 (e.g., silver) is shown as having been blanket electroplated over the entire exposed portions of the substrate 82 (which is conductive) and over the first metal 94 (which is also conductive). FIG. 4G depicts the completed first layer of the structure which has resulted from the planarization of the first and second metals down to a height that exposes the first metal and sets a thickness for the first layer.

Figure 4H:
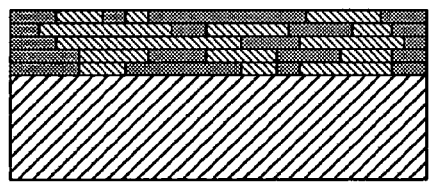
FIGS. 4H and 4I respectively depict the state of the process after formation of the multiple layers of the structure and after release of the structure from the sacrificial material.
Figure 4I:
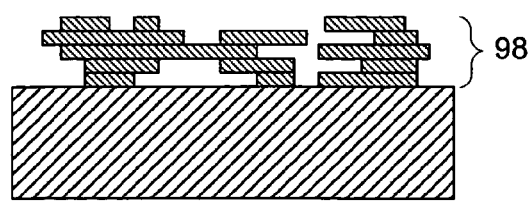

In FIG. 4H the result of repeating the process steps shown in FIGS. 4B-4G several times to form a multi-layer structure are shown where each layer consists of two materials. For most applications, one of these materials is removed as shown in FIG. 4I to yield a desired 3-D structure 98 (e.g. component or device).

Various embodiments of the invention are directed to formation of three-dimensional structures from materials some of which may be electrodeposited or electroless deposited. Some of these structures may be formed form a single layer of one or more deposited materials while others are formed from a plurality of layers each including at least two materials (e.g. two or more layers, more preferably five or more layers, and most preferably ten or more layers). In some embodiments microscale structures are produced that have features positioned with micron or near micron-level precision and with minimum features size on the order of microns to tens of microns. In other embodiments mesoscale structures with less precise feature placement (tens to hundreds of microns) and/or larger minimum features (tens to hundreds of microns) may be formed. In some embodiments microscale structures may have overall dimensions on the order of millimeters or even centimeters while in other embodiments the microstructures may have smaller overall dimensions. In some embodiments, mesoscale structures may have overall dimensions on the order of millimeters to centimeters or larger while in other embodiments they may be smaller. In still other embodiments, microscale structures may have higher precision and smaller minimum feature sizes.

The various embodiments, alternatives, and techniques disclosed herein may form multi-layer structures using a single patterning technique on all layers or using different patterning techniques on different layers. For example, Various embodiments of the invention may perform selective patterning operations using conformable contact masks and masking operations (i.e. operations that use masks which are contacted to but not adhered to a substrate), proximity masks and masking operations (i.e. operations that use masks that at least partially selectively shield a substrate by their proximity to the substrate even if only partial contact is made or no contact at all is made), non-conformable masks and masking operations (i.e. masks and operations based on masks whose contact surfaces are not significantly conformable), and/or adhered masks and masking operations (masks and operations that use masks that are adhered to a substrate onto which selective deposition or etching is to occur as opposed to only being contacted to it). Adhered mask may be formed in a number of ways including (1) by application of a photoresist, selective exposure of the photoresist, and then development of the photoresist, (2) selective transfer of pre-patterned masking material, and/or (3) direct formation of masks from computer controlled depositions of material. Adhered masks are typically destroyed upon their removal from a surface that was patterned while contact masks are not destroyed by their removal from the surface that was patterned.

Patterning operations may be used in selectively depositing material and/or may be used in the selective etching of material. Selectively etched regions may be selectively filled in or filled in via blanket deposition, or the like, with a different desired material. In some embodiments, the layer-by-layer build up may involve the simultaneous formation of portions of multiple layers. In some embodiments, depositions made in association with some layer levels may result in depositions to regions associated with other layer levels. Such use of selective etching and interlaced material deposited in association with multiple layers is described in U.S. patent application Ser. No. 10/434,519, by Smalley, and entitled "Methods of and Apparatus for Electrochemically Fabricating Structures Via Interlaced Layers or Via Selective Etching and Filling of Voids" which is hereby incorporated herein by reference as if set forth in full.

In the present application the following terms are generally intended to have the following definitions though the meaning of particular terms as used in particular contexts may vary from these definitions if the context makes it clear what the term is intended to mean in that circumstance.

The terms "three-dimensional structure", "structure", "part", "component", "device", and the like shall refer generally to intended or actually fabricated three-dimensional configurations (e.g. of structural material) that are intended to be used for a particular purpose. Such structures, etc. may, for example, be designed with the aid of a three-dimensional CAD system. In some embodiments, such structures may be formable from a single layer of structural material while in most embodiments, such structures will be formable from a plurality of adhered layers. When designing such structures, for example, the formation process that will be used in fabricating the structure may or may not be taken into consideration. For example, if the structure is to be formed from a plurality of adhered layers, it may be desirable to take into consideration the vertical levels that define layer transitions so that structural features are precisely located at layer boundary levels. The structures may be designed with sloping sidewalls or with vertical sidewalls. In designing such a three-dimensional structures they may be designed in a positive manner (i.e. features of the structure itself defined) or in a negative manner (i.e. regions or features of sacrificial material within a build volume defined), or as a combination of both. In some embodiments, the term "device" or phrase "device of desired configuration", or the like, is reversed for describing the device that is assembled from structural elements that have been moved into final desired relative positions and orientations via relative folding, rotating translation, bonding, retention via clipping, or the like.

The terms "build axis" or "build orientation" refer to a direction that is generally perpendicular to the planes of layers from which a three-dimensional structure is formed and it points in the direction from previously formed layers to successively formed layers. The build orientation will generally be considered to extend in the vertical direction regardless of the actual orientation, with respect to gravity, of the build axis during layer formation (e.g. regardless of whether the direction of layer stacking is horizontal relative to the earth's gravity, upside down relative to gravity, or at some other angle relative to the earth's gravity). In forming devices where structural elements are rotated into appropriate relative positions, the build orientation of some elements in the final desired configuration may end up reversed relative to other elements as compared to what it was during actually layer-on-layer build up.

The term "structural material" shall generally refer to one or more particular materials that are deposited during formation of one or more build layers at particular lateral positions, where the material is generally intended to form part or all of a final three-dimensional structure and where thicknesses of the particular material associated with one or more particular layers is typically substantially that of the thickness of that layer or the thicknesses of those layers. During formation of particular layers, structural material thickness may vary from the layer thicknesses by generally relative thin adhesion layer thicknesses, seed layer thicknesses, barrier layer thicknesses, or the like, or at edges of features where sloping sidewalls may exist. In some embodiments, the structural material associated with particular layers may be formed from a plurality of distinctly deposited materials whose combination defines an effective structural material.

The term "sacrificial material" shall generally refer to one or more particular materials that are deposited during formation of one or more build layers at particular lateral positions, where the material is generally intended to be removed from a final three-dimensional structure prior to putting it to its intended use. Sacrificial material does not generally refer to masking materials, or the like, that are applied during formation of a particular layer and then removed prior to completion of formation of that layer. Sacrificial material generally forms a portion of a plurality of build layers and is separated from structural material after formation of a plurality of layers (e.g. after completion of formation of all build layers). Some portion of a sacrificial material may become a pseudo structural material if it is completely encapsulated or effectively trapped by structural material such that it is not removed prior to putting the structure to use. For example, a copper sacrificial material may be intentionally encapsulated by a structural material (e.g. nickel or a nickel alloy) so as to improve thermal conductive or electrical conductive of the structure as a whole. The thicknesses of a particular sacrificial material associated with one or more particular layers is typically substantially that of the thickness of that layer or the thicknesses of those layers. During formation of particular layers, sacrificial material thickness may vary from the layer thicknesses by generally relative thin adhesion material thicknesses, seed material thicknesses, barrier material thicknesses, or the like, or at edges of features where sloping sidewalls may exist. In some embodiments, the sacrificial material associated with particular layers may be formed from a plurality of distinctly deposited material whose combination defines an effective sacrificial material.

The term "build layer", "structural layer", or simply "layer" generally refers to materials deposited within a build volume located between two planes spaced by a "layer thickness" along the build axis where at least one structural material exists in one or more lateral positions and at least one sacrificial material exists in one or more other lateral positions. During fabrication, build layers are generally stacked one upon another (with the exception of those portions that will be moved into relative position after formation of the layers and removal of sacrificial material) but in some embodiments, it is possible that build layers will be separated one from another, in whole or in part, by relative thin coatings of adhesion layer material, seed layer material, barrier layer material, or the like.

The term "layer thickness" is the height along the build axis between a lower boundary of a build layer and an upper boundary of that build layer. Layer thicknesses, for example may be in the two micron to fifty micron range, with ten micron to 30 micron being common. In some embodiments layer thicknesses may be thinner than 2 microns or thicker than fifty microns. In many embodiments, deposition thickness (i.e. the thickness of any particular material after it is deposited) is generally greater than the layer thickness and a net deposit thickness is set via one or more planarization processes which may include, for example, mechanical abrasion (e.g. lapping, fly cutting, polishing, and the like) and/or chemical etching (e.g. using selective or non-selective etchants). The lower boundary and upper boundary for a build layer may be set and defined in different ways. From a design point of view they may be set based on a desired vertical resolution of the structure (which may vary with height). From a data manipulation point of view, the vertical layer boundaries may be defined as the vertical levels at which data descriptive of the structure is processed or the layer thickness may be defined as the height separating successive levels of cross-sectional data that dictate how the structure will be formed. From a fabrication point of view, depending on the exact fabrication process used, the layer boundaries may be defined in a variety of different ways. For example by planarization levels or effective planarization levels (e.g. lapping levels, fly cutting levels, chemical mechanical polishing levels, mechanical polishing levels, vertical positions of structural and/or sacrificial materials after a relatively uniform etch back following a mechanical or chemical mechanical planarization process). For example, by levels at which process steps or operations are repeated. At levels at which, at least theoretically, lateral extends of structural material can be changed to define new cross-sectional features of a structure. Actually layer thickness achieved in a built structure will typically match closely a desired layer thickness but will deviate from the desired layer thickness by a tolerance associated with the formation process.

The terms "adhesion layer", "seed layer", "barrier layer", and the like refer to coatings of material that are thin in comparison to the layer thickness (e.g. less than 20% of the layer thickness, more preferably less than 10% of the layer thickness, and even more preferably less than 5% of the layer thickness). Such coatings may be applied uniformly over a previously formed layer, they may be applied over a portion of a previously formed layer and over patterned structural or sacrificial material existing on a current layer so that a non-planar seed layer results, or they may be selectively applied to only certain locations on a previously formed layer. In the event such coatings are non-selectively applied they may be removed (1) prior to depositing either a sacrificial material or structural material as part of a current layer or (2) prior to beginning formation of the next layer or they may remain in place through the layer build up process and then etched away after formation of a plurality of layers where the thinness of the coating may be relied on so that undercutting of structural material on two consecutive layers is not excessive and/or where thinness of the coatings may be relied on for their destructive removal between regions of sacrificial material located on successive layers.

The term "structural layer" shall refer to one or more structural materials deposited during formation of a particular build layer or to the configuration of such material within the lower and upper boundaries of the layer.

The term "sacrificial layer" shall refer to the one or more sacrificial materials deposited during formation of a particular build layer or to the configuration of such material within the lower and upper boundaries of the layer.

Some embodiments of the invention concern methods of assembling microstructures that comprise at least one material that can be plastically deformed so as to create an ultimate shape or configuration different than that which results from fabrication alone. In some embodiments of the invention, certain regions (e.g. portions of hinge elements) may be deformed beyond the plastic deformation limits of the material such that these regions break. In some embodiments, plastically deformed regions (e.g. all or portions of hinge regions) may be removed from the desired configuration of the device by etching, mechanical slicing or dicing, laser ablation or the like.

Some embodiments are directed to metallic microstructures fabricated at least partially using an electrochemical fabrication process (such as Microfabrica's EFAB® electrochemical fabrication process which may be implemented using contact masks, proximity masks, adhered masks, and the like) in which one or more portions of the microstructure or one or more regions separating distinct elements of the microstructure are deformed by imposing forces on directly or indirectly on the microstructure which causes a permanent, plastic deformation.

Figure 5A:
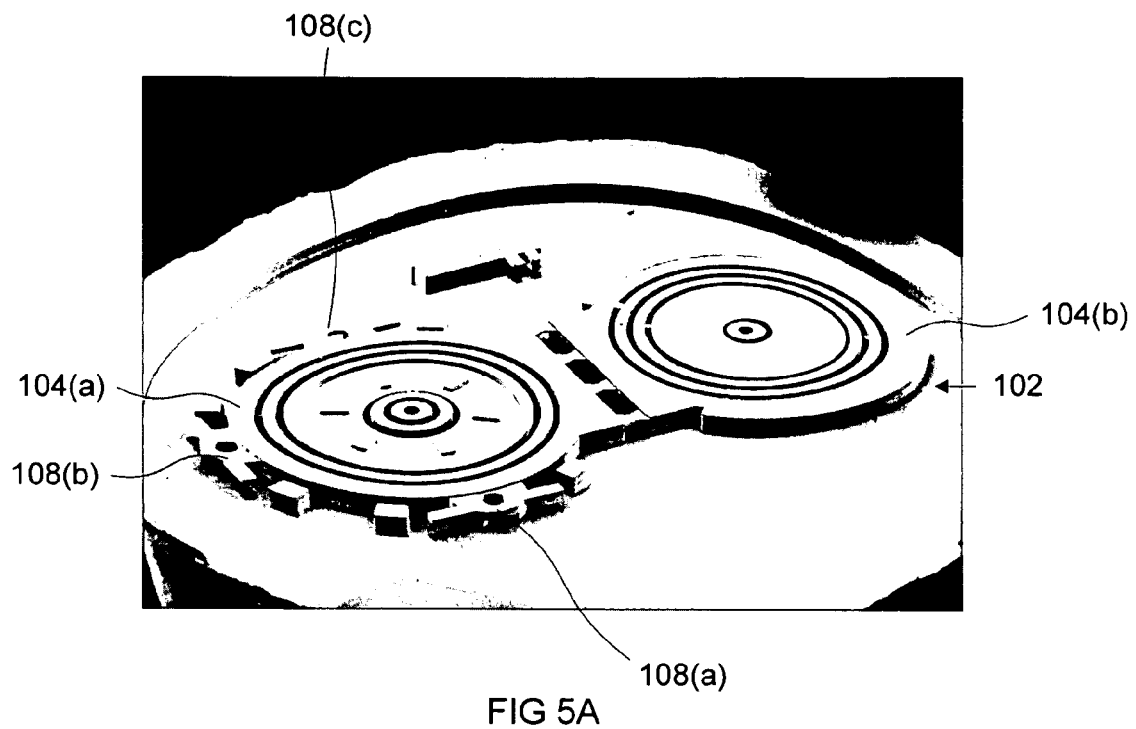
FIG. 5A depicts a structure produced from a structural material by electrochemical fabrication after release of a sacrificial material that was deposited, and allowed to build up, during the layer-by-layer formation process.
Figure 5B:
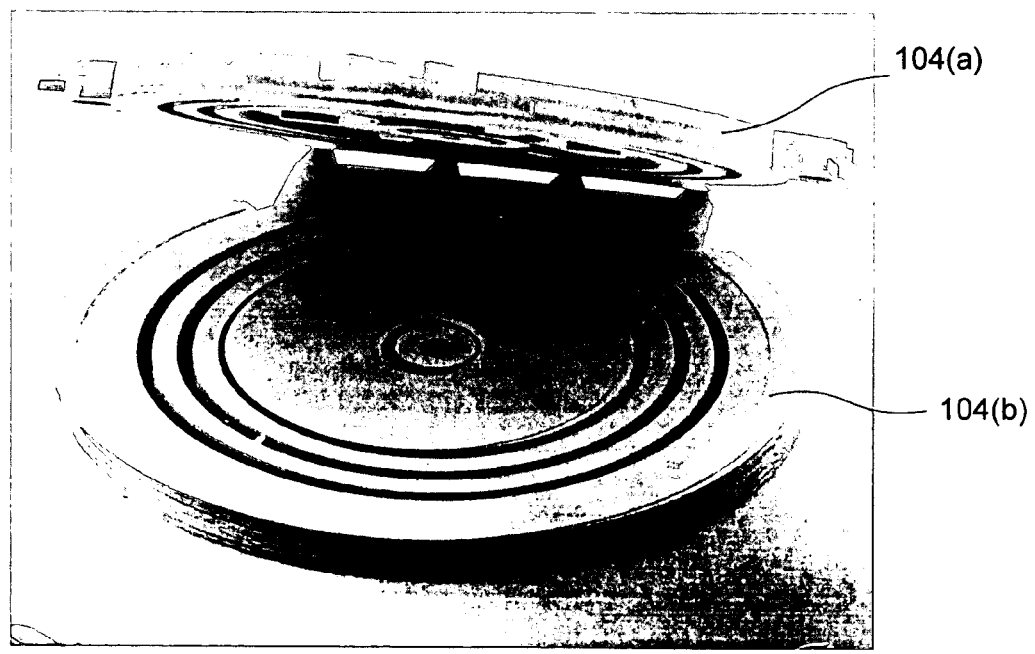
FIG. 5B depicts a close up of the structure of FIG. 5A after the left most portion of structure of FIG. 5A is bent toward the right most portion of the structure of FIG. 5A about the four hinge elements that connect the two halves of the structures.
Figure 5C:
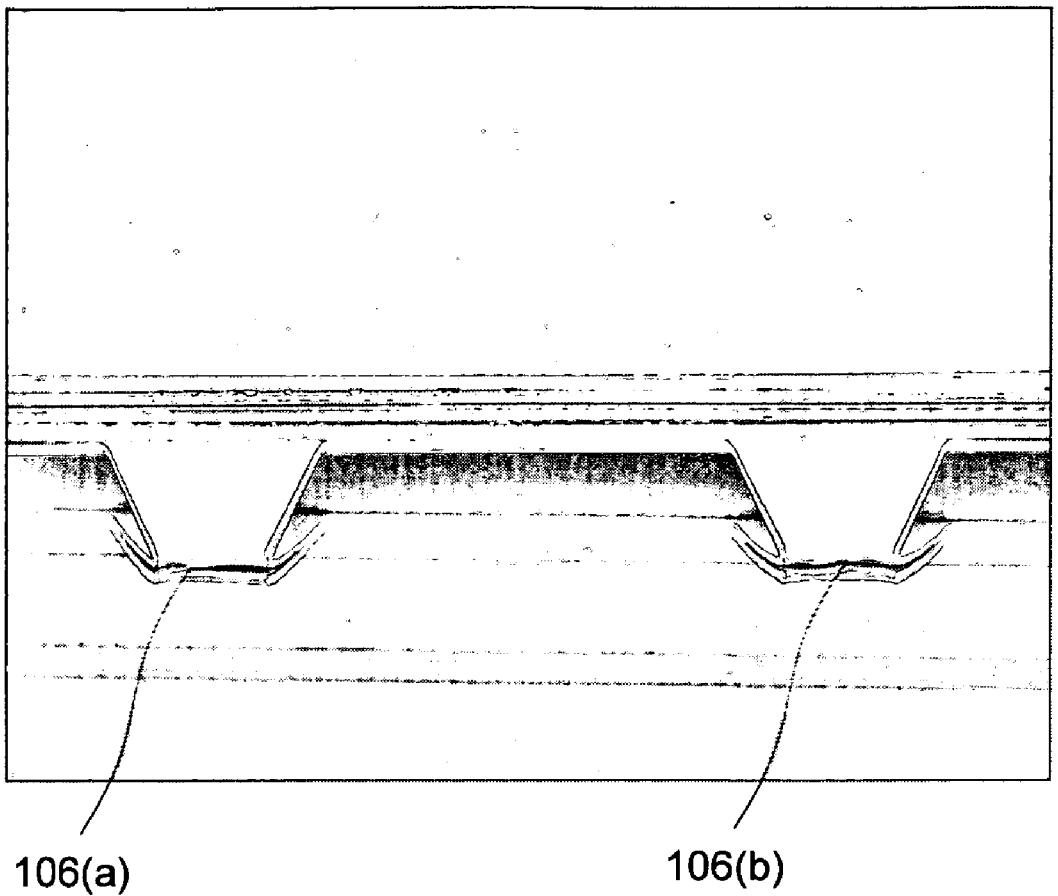
FIG. 5C depicts a view of two of the hinges of the bent over structural halves of the structure of FIG. 5A.

An example of an embodiment of the invention is shown in FIGS. 5A-5C which depict a split open microcombustor (such as that described in U.S patent application Ser. No. 09/755,985, filed Jan. 5, 2001, by Cohen, et al.) produced by the electrochemical fabrication process discussed above in FIGS. 2A-2F or in FIGS. 4A-4I. This structure is designed as a 'clamshell' with two halves, one of which can be folded over the other. 'Hinge' structures are provided to link the two halves together, and the application of an appropriate force to the structure causes the hinges to bend so as to achieve the desired assembly.

FIG. 5A shows a perspective view of the microcombustor 102 as fabricated but prior to assembly.

FIG. 5B shows the microcombustor after one half 104(a) has been partially folded over the other half 104(b). When plastically deformed, the structural material (e.g. nickel) may exhibit 'springback', such that the angle through which the half was deflected during assembly is greater than the angle resulting after removal of the assembly force. When this springback effect is a problem it may be addressed in a variety of ways, for example: (1) by designing the bending hinge or other elements to fracture during folding or after folding is completed (e.g. after some lapse of time); (2) cutting, etching, laser ablation, or otherwise removing the bendable hinge elements; (3) designing pivotal elements that allow rotation and/or other movement but which do not bend; (4) heat treating or otherwise treating the bent hinges to relieve stress induced in them; (5) locking the bent over structure in place with a bonding material (e.g. reflowed solder, epoxy, gold eutectic bonding, thermocompression bonding, or the like) or clips and ignoring stresses within the bent hinge elements; (6) diffusion bonding the two elements together with or without an intermediate material; and/or (7) at least partially encapsulating the folded structure in a secondary material while it is held in place temporarily by clamps, pressure, vacuum or the like. Variations of the retention techniques set forth in U.S. patent application Ser. No. 10/677,556, filed Oct. 1, 2003, by Cohen, and entitled "Monolithic Structures Including Alignment and/or Retention Fixtures for Accepting Components" may be used to clamp the two structural elements of the device,. Bonding techniques set forth in U.S. patent application Ser. No. 11/173,241, filed Jun. 30, 2005, by Kumar, and entitled "Probe Arrays and Method for Making", and in U.S. patent application Ser. No. 10/841,382, filed May 7, 2004, by Zhang, and entitled "Method of Electrochemically Fabricating Multilayer Structures Having Improved Interlayer Adhesion" may be used. The disclosure of each of these referenced applications is incorporated herein by reference as if set forth in full.

FIG. 5C shows the 'hinge' structure 106(a) and 106(b) (here consisting of two layers, the topmost of which has deformed plastically, and the bottommost of which has fractured during the deformation due to excessive tensile loading).

Some embodiments may include features which facilitate the assembly process such as the 'handles' 108(a)-108(c) shown in FIG. 5A.

Some embodiments offer various benefits when compared to non-split production processes. For example, at the cost of increased horizontal footprint, structures produced may be produced with few layers than would otherwise be the case. As another example, the formed structures offer enhanced access to interior regions of the structure (e.g., to facilitate etching of sacrificial material, and/or to allow location of other desired materials into selective regions after removal of the sacrificial material and/or access to materials internal to the structure to allow additional processing operations to be performed) prior to forming the final structure.

Figure 6:
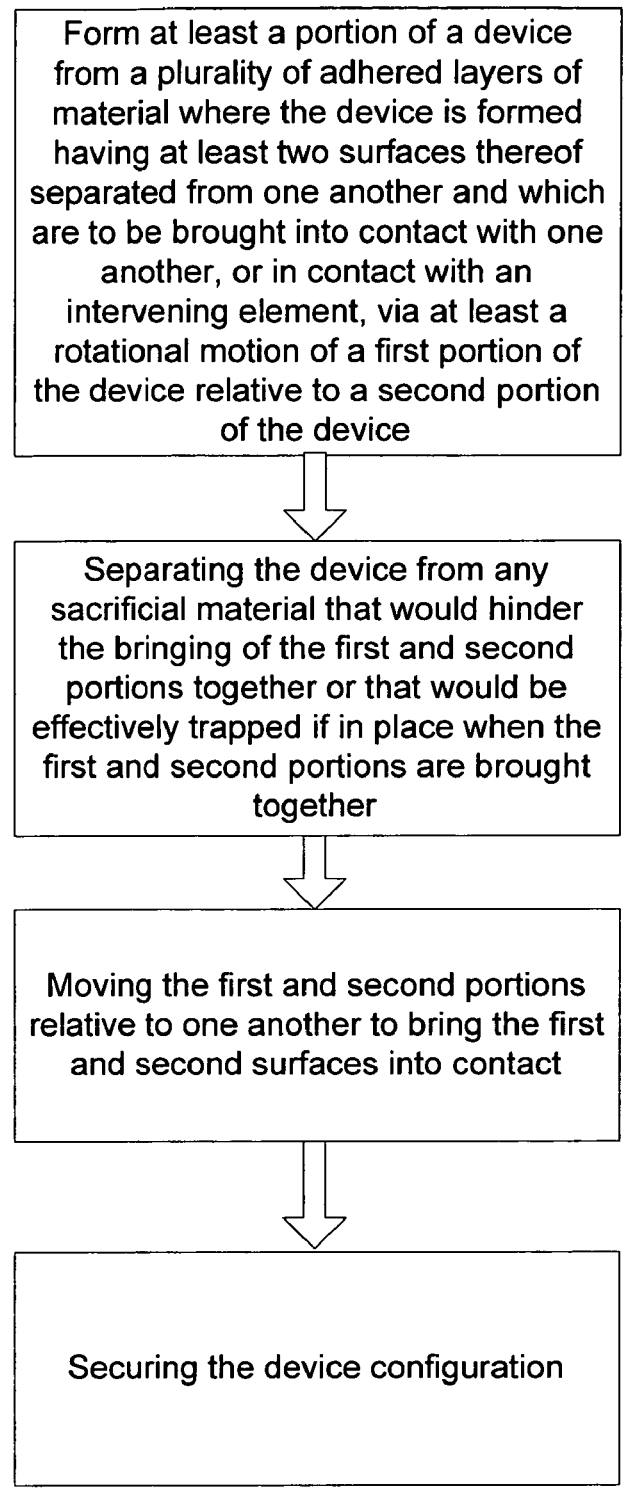
FIG. 6 provides a flow chart of the some basic operations used in some embodiments of the invention.

FIG. 6 provides a flow chart of the some basic operations used in some embodiments of the invention.

In still other embodiments, improved methods and structures for alignment during the folding operation and/or retention subsequent to the folding operation are provided. Embodiments of the invention may be applicable to the fabrication of various micro-scale devices and meso-scale devices, such as microfluidic devices (e.g., heat exchangers, cooling networks, channel networks, inkjet print heads). Other micro-scale and meso-scale devices that may take advantage of the present invention include RF and microwave devices and particularly those having complex, narrow, and potential dead-end passages. The techniques may also be applicable to other devices and particularly to those whose final forms present difficulties for removing sacrificial material or whose production could benefit from a reduction in the number of layers that are used in formation of the device (e.g. RF and microwave devices as described in U.S. patent application Ser. No. 10/607,931, filed Jun. 27, 2003, by Brown, et al.).

Figure 7A:
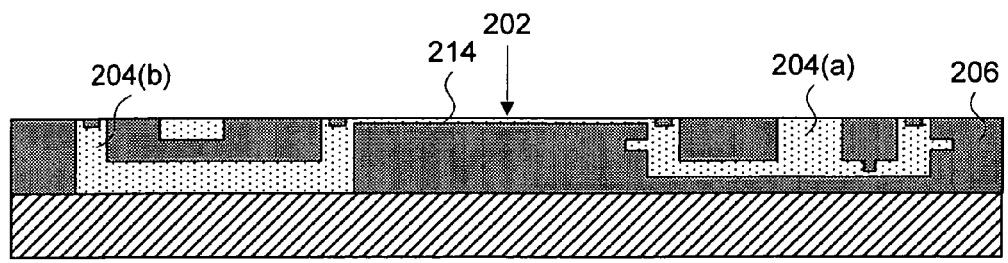
FIGS. 7A-7G depict various steps in a process of completing the electrochemical fabrication of the structure according to an embodiment of the invention where the structure includes guiding elements to aid in alignment of the two halves as they are mated.

FIGS. 7A-7G depict various states in a process of fabricating an example structure or device (e.g. an inkjet printhead) according to an embodiment of the invention. In FIG. 7A, the layer build-up portion of an electrochemical fabrication process (e.g. such as that shown in FIGS. 2A-2F or 4A-4I has been completed and the unfolded structure 202 is embedded in sacrificial material 206, where the unfolded structure consists of a left or bottom half 204(b) and a right or top half 204(a) which when folded together will create a device of desired configuration.

Figure 7B:
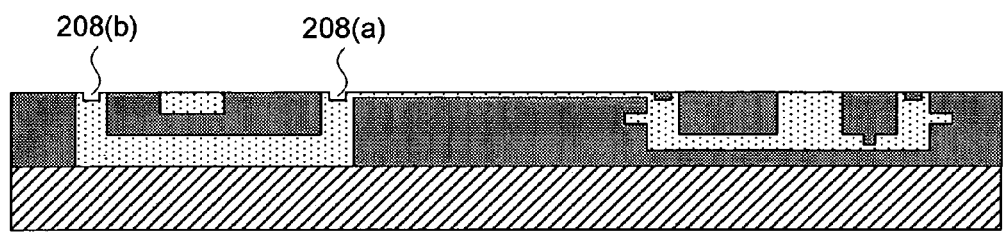
Figure 7C:
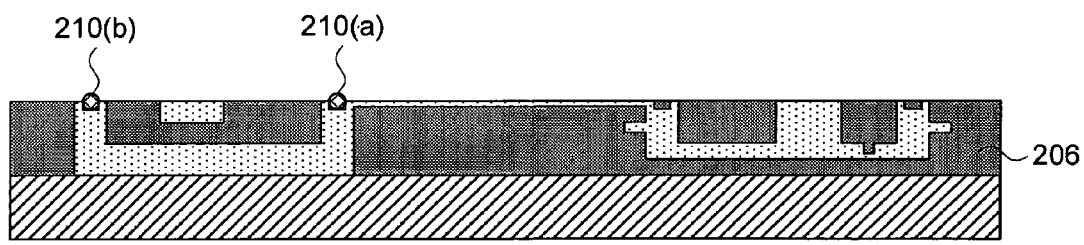

FIGS. 7B-7C illustrate operations that may be used to provide improved guidance and/or alignment through the use of objects (e.g., balls) which are added to the structure/device, thus relieving the requirements for extremely precise folding of the hinge 214. In FIG. 7B, the sacrificial material is shown as having been partially etched to expose recesses 208(a) and 208(b) in the leftmost portion 204(b) of the device. These voids will receive the alignment objects, e.g. balls, 210(a) and 210(b). The partial etching may be carried out by locally applying an etchant bath, masking with photoresist or a conformable contact mask prior to etching (at least protecting those portions of the sacrificial material not to be initially removed), or the like etc. In FIG. 7C, the alignment objects 210(a) and 210(b) have been placed in the recesses. The alignment objects may be located by various techniques. One such technique may involve the use of pick-and-place equipment to place one or more objects at a time. Another such technique may involve a batch process such as a self-assembly process based on vibration or fluid flow, etc. For example, since the remainder of the surface is flat at this stage of the process, the objects will only remain in the recesses if applied to the surface in quantity and then poured off.

Figure 7D:
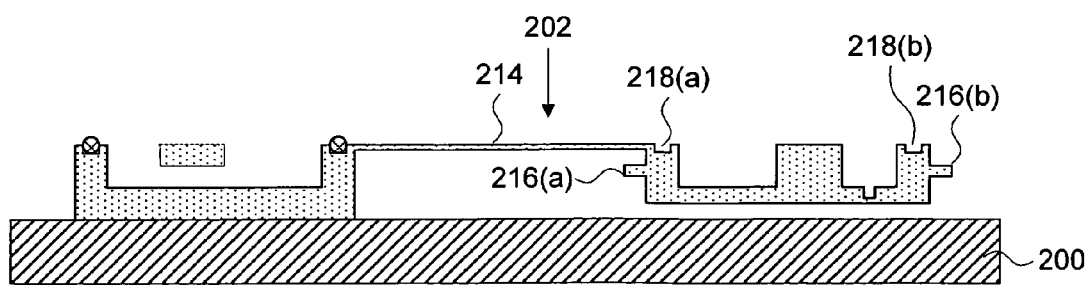

In FIG. 7D, the sacrificial material has been removed leaving behind the device 202 still attached to a substrate 200. It is necessary to prevent loss of the alignment objects 210(a) and 210(b) from the recesses 208(a) and 208(b) during this process. This can be accomplished in a variety of ways. As a first example, the objects may be held in place mechanically using a plate or pin. As a second example, the objects may be held in place magnetically (if the balls are magnetic). As a third example, the objects may include some form of a temporary or permanent adhesive that can fix them in place prior to removing the sacrificial material, for example, a wax or low melting point metal coating that can be made to bond to the sides or bottom of the recesses 208(a) and 208(b) by heating or pressure. As a fourth example, solder may be deposited into the voids and reflowed while the alignment objects are being pressed in place. As a fifth example, the depth of the recesses may be slightly deeper than width of the recesses while the width of objects (e.g. balls) is slightly larger than the width of the recesses and mechanical pressure is used to wedge the objects into the recesses. Other retention methods are also possible.

FIG. 7D also illustrates three features of the rightmost portion 204(a) of the unfolded device 202: a thin, readily-bent hinge 214; handles 216(a) and 216(b); and recesses 218(a) and 218(b) for receiving the alignment objects as folding is nearing completion and for guiding the final closure of the two halves 204(a) and 204(b) as folding is being completed. The hinge or hinges may be designed so that they are narrower (in the plane of the substrate) in the region where bending is to occur (e.g. similar to the design of the hinges shown in FIGS. 5A-5C). Alternatively, they can be designed so that they are thinner (e.g., has fewer layers) in the region where bending is to preferentially occur. Both of these approaches can be used together, though neither is visible in FIGS. 7A-7G. The handles may perform one or more functions.

They may facilitate the folding operation by providing a feature to which force can be applied. They may be used to provide features to aid in the retention of the two halves of the device (e.g. by encapsulation or clipping).

In some alternative embodiments, alignment objects 210(a) and 210(b) may be replaced or supplemented by structures formed as part of sides 204(a) or 204(b) that extend above the depicted upper or mating surfaces (e.g. by adding one or more layers) or by structures that are bent from one or both of sides 204(a) or 204(b) so that they extend above the mating surfaces at an angle useful for guiding the sides together during mating. For example, handle-like structures may be bent from structure 204(a) and/or 204(b) by something less than a 90° angle to give sloped guide structures that may aid in alignment during foldover. Such bending in some embodiments may occur before the release of half 204(a) from the substrate or after the release (for example when they tend to bend more readily than the hinge elements).

Figure 7E:
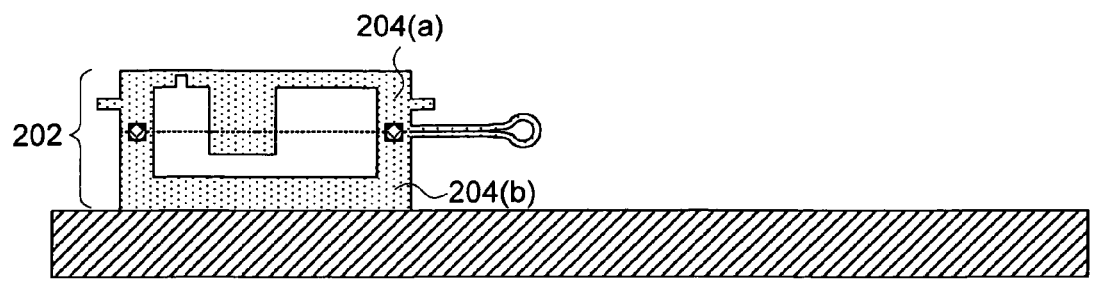

In FIG. 7E, the two halves of the device 204(a) and 204(b) have been folded together. As illustrated, the hinge may be designed so that it is long enough that it need not fold through a very small radius (thus reducing the risk of it unintentionally fracturing). Upon bending, the 'leafs' of the spring are able to come together close to the device, ensuring that the mating surfaces of the device are adjacent to the hinge mate with little or no gap. In some embodiments, a temporary or permanent retaining means may be used to hold the two halves together. Such a retaining means may be a mechanical clamp, one or more contact members for pushing section 204(a) down, vacuum applied to side 204(a) via one or more vacuum lines extending through section 204(b), magnetic force, pressure, electrical force, and the like (not shown). In alternative embodiments or enhanced embodiments, retention elements may not hold the two elements of the structure together, or in addition to holding the elements together, the ends of the leafs of the hinges may be clamped bonded or otherwise held together close to where they join the elements (thus removing any spring back effects that the springs might otherwise exert.

Figure 7F:
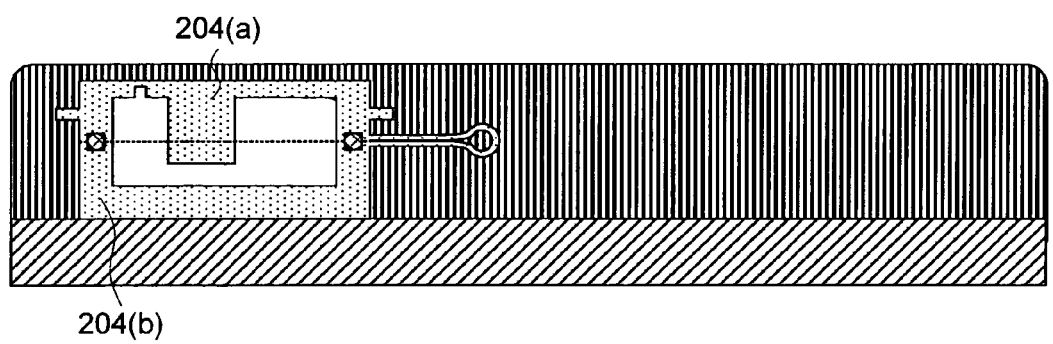

In FIG. 7F, the entire device is shown as encapsulated (e.g., with an epoxy). This would be done while the upper section is pushed against the lower section using, for example, the clamping mechanism described above. The clamp may be removed after the encapsulant has solidified, or may remain embedded in the encapsulant.

Figure 7G:
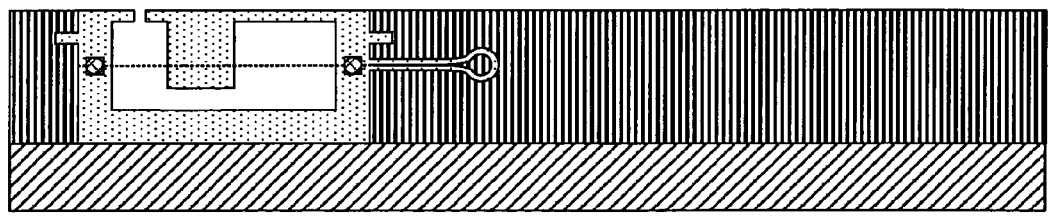

In FIG. 7G, the encapsulant and the topmost portion of section 204(a) of the device has been removed by planarization, via, for example, lapping or diamond fly cutting, yielding a flat surface. In the example of FIG. 7G, the planarization operation exposes an opening in the device 202 which was intentionally blocked to prevent any incursion of the encapsulant into any cavities between or within the elements The handles become and remain embedded in the encapsulant thereby causing a mechanical locking of the halves together instead of relying solely on friction or chemical bonding between the device and encapsulant material to prevent the upper section 204(a) from separating from the lower section 204(b). The encapsulant may serve multiple functions: (1) to clamp the two sections together, (2) to provide a secondary barrier for fluid leakage from the device, (3) to protect the device from the environment, (4) to make the device more mechanically robust, and (5) to strengthen the attachment of the device to the substrate; and/or (5) to provide hermetic packaging of the device.

In some alternative embodiments, sides 204(a) and 204(b) may include indentations and/or other features (besides or in addition) to handles that will enable mechanical interlocking with an encapsulant. In some other alternative embodiments, the final folded structure may be released from the substrate or even transferred to a different substrate. In some other embodiments, hinges may be removed after folding.

Figure 8A:
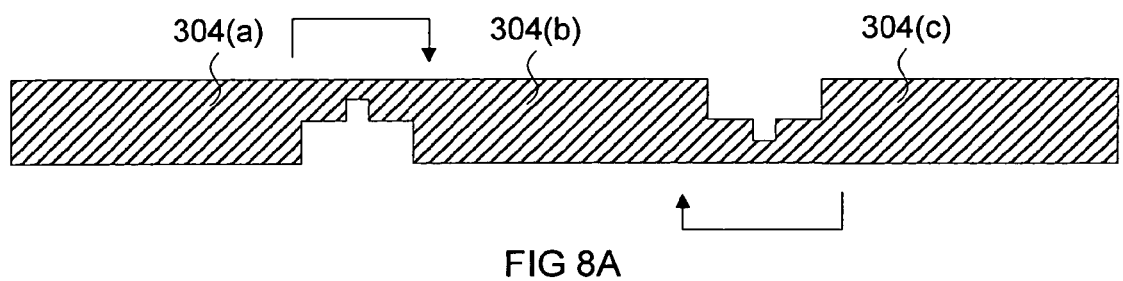
FIGS. 8A-8B illustrate side views of an unfolded structure and a side view of the structure after right and left elements are folded under and over the middle element to produce a device of desired configuration.
Figure 8B:
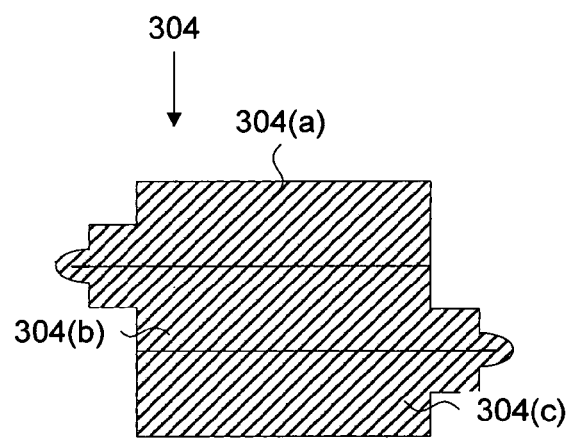
Figure 9A:
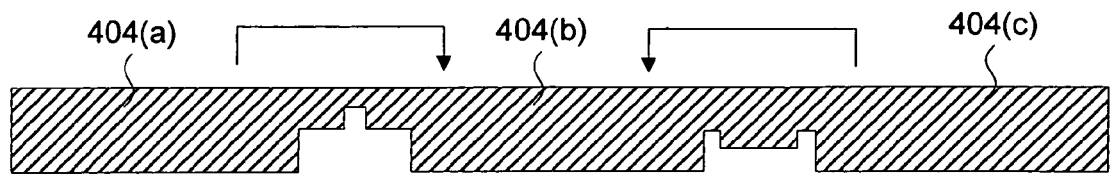
FIGS. 9A-9C illustrate side views of an unfolded structure and side views of the structure after the left element is folded over the middle element and after the right element is folded over both the middle element and the overlying left element to produce a device of desired configuration.
Figure 9B:
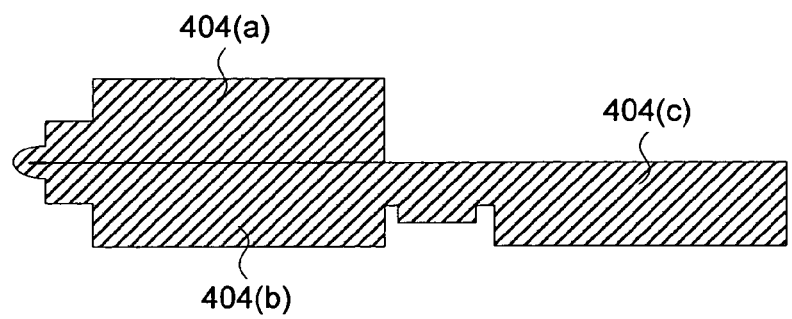
Figure 9C:
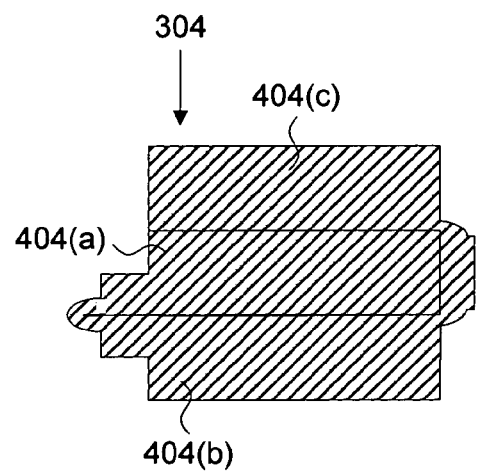
Figure 10A:
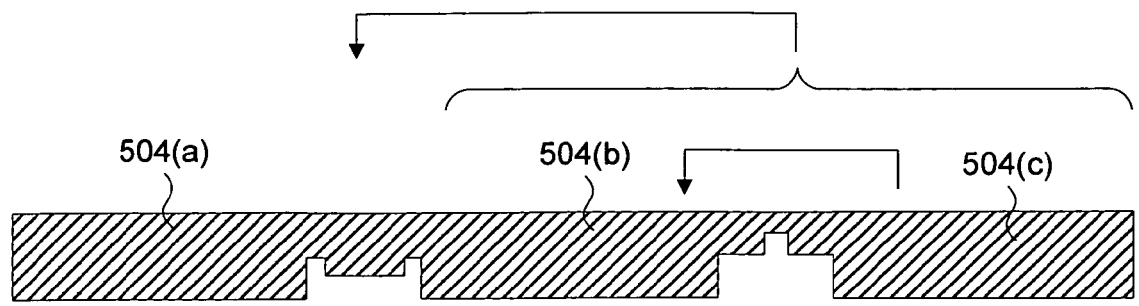
FIGS. 10A-10C illustrate side views of an unfolded structure and side views of the structure after the right element is folded over the middle element and after the combination of right and middle elements are folded over the left element to produce a device of desired configuration.
Figure 10B:
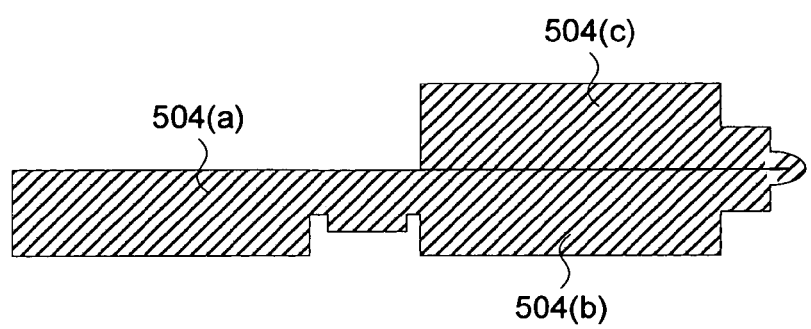
Figure 10C:
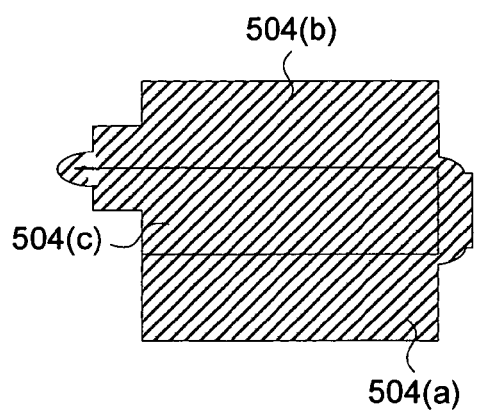
Figure 11:
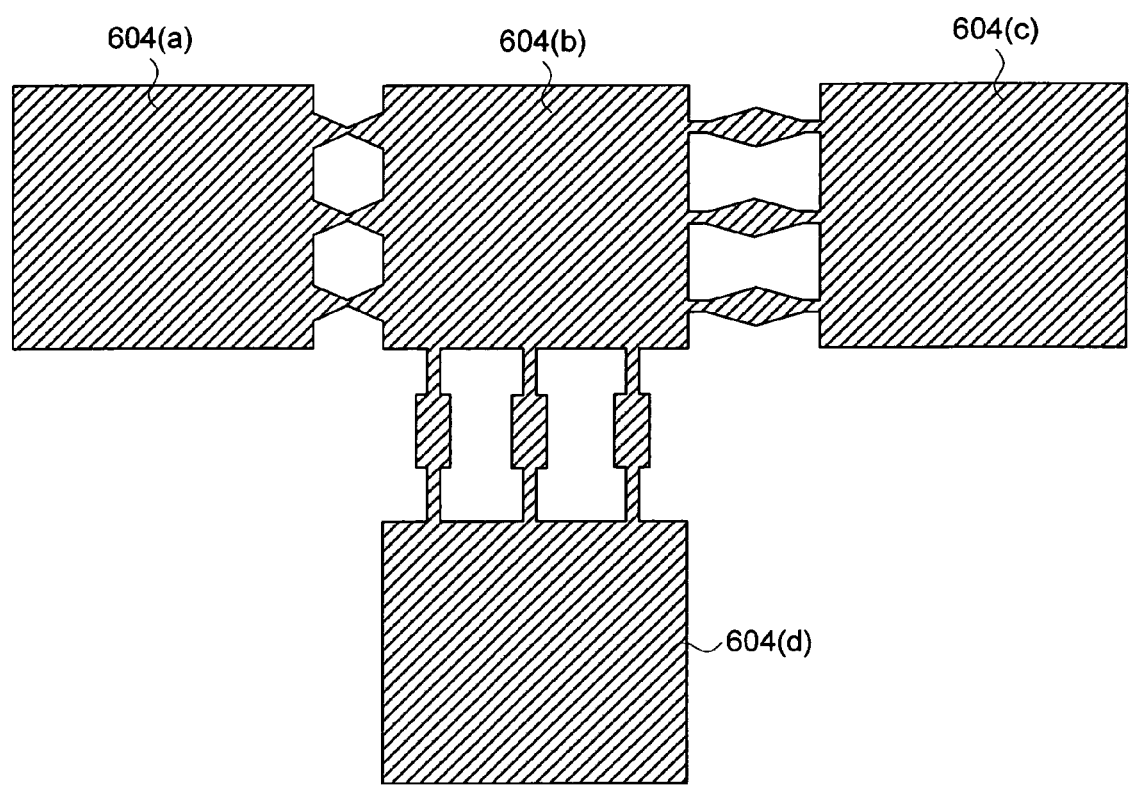
FIG. 11 illustrates an embodiment where four unfolded structures are connected by hinge elements, three of which may be folded over one another and over the fourth element to yield a device of desired configuration.

In other embodiments more than a single folding operation, or other positioning, locating, or aligning operation, may be used to assembly a structure. For example in some embodiments, two or more foldovers may be used. In some such embodiments foldovers may occur from two outer elements (e.g. 304(a) and 304(c) of FIGS. 8A and 8B) to the top and bottom surfaces of a central element (e.g. 304(b) of FIGS. 8A and 8B), two outer elements (e.g. 404(a) and 404(c) of FIGS. 9A-9C) may fold over to stack on top of the central element (e.g. 404(b) of FIGS. 9A-9C) with one above the other, one outer element (e.g. 504(c) of FIGS. 10A-10C) may fold onto the central element (e.g. 504(b) of FIGS. 10A-10C) and the combination may fold onto the other outer element (e.g. 504(a) of FIGS. 10A-10C). In still other embodiments, a linear array of four or more elements may be folded or rolled up together. In even further embodiments other arrays of elements may be folded together as illustrated in FIG. 11 where element 604(b) may be folded onto 604(a) and 604(c) folded onto the assembly or preassembly of 604(a) and 604(b) and finally 604(d) folded on to the assembly or preassembly of 604(a)-604(c).

In the various embodiments of the invention, the device of desired configuration is formed from a plurality of elements that each make up all or part of one or more levels of the device (each element may be formed from one or more layers) where each element is rotated or translated into a desired position relative to the other elements. In some embodiments, one or more levels of the device of desired configuration may be formed from multiple folded elements that lay not only above or below other elements but also lay beside other elements which exist on the same level with in adjacent locations, in spaced locations where the spacing may be open or occupied by an intervening element that may be formed separately from the rest of the structure or that may be carried by an element that forms all or a portion of another level of the device.

In some embodiments the last layer or an intermediate layer of the structure formed may include a dielectric material that will be located between and possibly electrically isolate the adjacent elements or portions of adjacent element of the assembly (i.e. the device of desired configuration). The hinges may be formed from the dielectric or from conductive material.

In some embodiments hinges may be formed on the last layer or multiple layers of an element, the first layer or multiple layers of an element or they may be formed on one or more intermediate layers of an element. In some embodiments, elements may have similar mating dimensions (e.g. X and Y dimensions) while in other embodiments elements may be of different sizes. As noted above, in some embodiments multiple elements may overlay different portions of a common surface of another element.

In some embodiments, one or more solder deposits may be included on one or more elements and upon foldover, the solder may be used to bond the multiple elements together or even hermetically seal an interior portion of the assembly.

In some embodiments, diffusion bonding, with or without an intermediate diffusion material may be used to adhere two or more elements together upon foldover.

In some embodiments mating surface need not be flat but instead may include mating indentation(s) and protrusion(s). In some embodiments, the indentations may snugly fit together while in other embodiments the indentations may be larger than the protrusions to allow mating of a reasonable tolerance. In some embodiments, solder reflow may be used to further enhance mating alignment. In some embodiments, stair stepping on mating protrusions between layers may be reduced by use of selective and/or partial etching (e.g. partial etching of sacrificial material and then chemical or electrochemical etching of protrusions).

In some embodiments after partial or complete removal of sacrificial material other material may be deposited prior to foldover (e.g. permalloy may be made to fill voids in one or more elements. Deposition of other materials may occur via electroplating, electroless deposition, electrophoretic deposition, sputtering, spreading, spinning, and the like).

In some embodiments handles, bending tabs, or other desired features may be added to both elements of a mating pair which may allow improvements in alignment or in ease of alignment and/or in ensuring mechanical interlocking of the elements without requiring bonding to a substrate. In some embodiments, holes may extend through one element that will align with holes that fully extend through or partially extend through one or more mating elements when assembly occurs and through which one or more pins (e.g. via compression and/or thermally induced clearance), screws, bolts, rivets or other retention elements may be inserted and which may be used to retain the device, or a portion of the device, in its desired configuration In some embodiments, instead of, or in addition to rotational foldover being used to mate surfaces, translational motion may be used to cause mating of initially separated surfaces (e.g. a relative lowering of one surface onto another, a lifting and sliding of one surface over and then onto another, or a swinging of one surface into mating position with another (hinges rotate but element doesn't).

In some embodiments the formation of devices may include various post layer formation operations which may occur before or after complete assembly. Some such operations may include diffusion bonding techniques which tend to enhance interlayer adhesion. Some embodiments may employ diffusion bonding or the like to enhance adhesion between successive layers of material. Various teachings concerning the use of diffusion bonding in electrochemical fabrication process is set forth in U.S. Patent Application No. 60/534,204 which was filed Dec. 31, 2003 by Cohen et al. which is entitled "Method for Fabricating Three-Dimensional Structures Including Surface Treatment of a First Material in Preparation for Deposition of a Second Material"; U.S. patent application Ser. No. 10/841,382, filed May 7, 2004 by Zhang, et al., and which is entitled "Method of Electrochemically Fabricating Multilayer Structures Having Improved Interlayer Adhesion"; U.S. patent application Ser. No. 10/841,384, filed May 7, 2004 by Zhang, et al., and which is entitled "Method of Electrochemically Fabricating Multilayer Structures Having Improved Interlayer Adhesion". Each of these applications is incorporated herein by reference as if set forth in full.

Further teachings about planarizing layers and setting layers thicknesses and the like are set forth in the following U.S. patent applications which were filed Dec. 31, 2003: (1) U.S. Patent Application No. 60/534,159 by Cohen et al. and which is entitled "Electrochemical Fabrication Methods for Producing Multilayer Structures Including the use of Diamond Machining in the Planarization of Deposits of Material" and (2) U.S. Patent Application No. 60/534,183 by Cohen et al. and which is entitled "Method and Apparatus for Maintaining Parallelism of Layers and/or Achieving Desired Thicknesses of Layers During the Electrochemical Fabrication of Structures". An additional filings providing teachings related to planarization are found in U.S. patent application Ser. No. 11/029,220, filed Jan. 3, 2005 by Frodis, et al., and which is entitled "Method and Apparatus for Maintaining Parallelism of Layers and/or Achieving Desired Thicknesses of Layers During the Electrochemical Fabrication of Structures". These patent filings are each hereby incorporated herein by reference as if set forth in full herein.

Further teaching about transfer structures from one surface to another and bonding the structure to the new surface are described in U.S. patent application Ser. No. 11/173,241, filed Jun. 30, 2005, by Kumar et al., and entitled "Probe arrays and method for making", and in U.S. patent application Ser. No. 434,493, filed May 7, 2003, by Thompson et al., and entitled "Electrochemically Fabricated Structures Having Dielectric or Active Bases and Methods of and Apparatus for Producing Such Structures".

Structural or sacrificial dielectric materials may be incorporated into embodiments of the present invention in a variety of different ways. Such materials may form a third material or higher deposited on selected layers or may form one of the first two materials deposited on some layers. Additional teachings concerning the formation of structures on dielectric substrates and/or the formation of structures that incorporate dielectric materials into the formation process and possibility into the final structures as formed are set forth in a number of patent applications filed Dec. 31, 2003. The first of these filings is U.S. Patent Application No. 60/534,184 which is entitled "Electrochemical Fabrication Methods Incorporating Dielectric Materials and/or Using Dielectric Substrates". The second of these filings is U.S. Patent Application No. 60/533,932, which is entitled "Electrochemical Fabrication Methods Using Dielectric Substrates". The third of these filings is U.S. Patent Application No. 60/534,157, which is entitled "Electrochemical Fabrication Methods Incorporating Dielectric Materials". The fourth of these filings is U.S. Patent Application No. 60/533,891, which is entitled "Methods for Electrochemically Fabricating Structures Incorporating Dielectric Sheets and/or Seed layers That Are Partially Removed Via Planarization". A fifth such filing is U.S. Patent Application No. 60/533,895, which is entitled "Electrochemical Fabrication Method for Producing Multi-layer Three-Dimensional Structures on a Porous Dielectric". Additional patent filings that provide teachings concerning incorporation of dielectrics into the EFAB process include U.S. patent application Ser. No. 11/139,262, filed May 26, 2005 by Lockard, et al., and which is entitled "Methods for Electrochemically Fabricating Structures Using Adhered Masks, Incorporating Dielectric Sheets, and/or Seed Layers that are Partially Removed Via Planarization"; and U.S. patent application Ser. No. 11/029,216, filed Jan. 3, 2005 by Cohen, et al., and which is entitled "Electrochemical Fabrication Methods Incorporating Dielectric Materials and/or Using Dielectric Substrates". These patent filings are each hereby incorporated herein by reference as if set forth in full herein.

The patent applications and patents set forth below are hereby incorporated by reference herein as if set forth in full. The teachings in these incorporated applications can be combined with the teachings of the instant application in many ways: For example, enhanced methods of producing structures may be derived from some combinations of teachings, enhanced structures may be obtainable, enhanced apparatus may be derived, and the like.

| US Pat App No, Filing Date US App Pub No, Pub Date | Inventor, Title |
|---|---|
| 09/493,496 - Jan. 28, 2000 | Cohen, "Method For Electrochemical Fabrication" |
| 10/677,556 - Oct. 1, 2003 | Cohen, "Monolithic Structures Including Alignment and/or Retention Fixtures for Accepting Components" |
| 10/830,262 - Apr. 21, 2004 | Cohen, "Methods of Reducing Interlayer Discontinuities in Electrochemically Fabricated Three-Dimensional Structures" |
| 10/271,574 - Oct. 15, 2002 2003-0127336A - Jul. 10, 2003 | Cohen, "Methods of and Apparatus for Making High Aspect Ratio Microelectromechanical Structures" |
| 10/697,597 - Dec. 20, 2002 | Lockard, "EFAB Methods and Apparatus Including Spray Metal or Powder Coating Processes" |
| 10/677,498 - Oct. 1, 2003 | Cohen, "Multi-cell Masks and Methods and Apparatus for Using Such Masks To Form Three-Dimensional Structures" |
| 10/724,513 - Nov. 26, 2003 | Cohen, "Non-Conformable Masks and Methods and Apparatus for Forming Three-Dimensional Structures" |
| 10/607,931 - Jun. 27, 2003 | Brown, "Miniature RF and Microwave Components and Methods for Fabricating Such Components" |
| 10/841,100 - May 7, 2004 | Cohen, "Electrochemical Fabrication Methods Including Use of Surface Treatments to Reduce Overplating and/or Planarization During Formation of Multi-layer Three-Dimensional Structures" |
| 10/387,958 - Mar. 13, 2003 2003-022168A - Dec. 4, 2003 | Cohen, "Electrochemical Fabrication Method and Application for Producing Three-Dimensional Structures Having Improved Surface Finish" |
| 10/434,494 - May 7, 2003 2004-0000489A - Jan. 1, 2004 | Zhang, "Methods and Apparatus for Monitoring Deposition Quality During Conformable Contact Mask Plating Operations" |
| 10/434,289 - May 7, 2003 20040065555A - Apr. 8, 2004 | Zhang, "Conformable Contact Masking Methods and Apparatus Utilizing In Situ Cathodic Activation of a Substrate" |
| 10/434,294 - May 7, 2003 2004-0065550A - Apr. 8, 2004 | Zhang, "Electrochemical Fabrication Methods With Enhanced Post Deposition Processing" |
| 10/434,295 - May 7, 2003 2004-0004001A - Jan. 8, 2004 | Cohen, "Method of and Apparatus for Forming Three-Dimensional Structures Integral With Semiconductor Based Circuitry" |
| 10/434,315 - May 7, 2003 2003-0234179 A - Dec. 25, 2003 | Bang, "Methods of and Apparatus for Molding Structures Using Sacrificial Metal Patterns" |
| 10/434,103 - May 7, 2004 2004-0020782A - Feb. 5, 2004 | Cohen, "Electrochemically Fabricated Hermetically Sealed Microstructures and Methods of and Apparatus for Producing Such Structures" |
| 10/841,006 - May 7, 2004 | Thompson, "Electrochemically Fabricated Structures Having Dielectric or Active Bases and Methods of and Apparatus for Producing Such Structures" |
| 10/434,519 - May 7, 2003 2004-0007470A - Jan. 15, 2004 | Smalley, "Methods of and Apparatus for Electrochemically Fabricating Structures Via Interlaced Layers or Via Selective Etching and Filling of Voids" |
| 10/724,515 - Nov. 26, 2003 | Cohen, "Method for Electrochemically Forming Structures including Non-Parallel Mating of Contact Masks and Substrates" |
| 10/841,347 - May 7, 2004 | Cohen, "Multi-step Release Method for Electrochemically Fabricated Structures" |
| 10/841,001 - May 7, 2004 | Cohen, "Methods for Electrochemically Fabricating Multi-Layer Structures Including Regions Incorporating Maskless, Patterned, Multiple Layer Thickness Depositions of Selected Materials" |

Furthermore, U.S. application Ser. Nos. 11/435,809, filed May 16, 2006: 60/681,788, filed May 16, 2005; 60/379,182, filed May 7, 2002; 60/430,809, filed Dec. 2, 2002; and 60/415,374, filed Oct. 1, 2002 are incorporated herein by reference.

Additional material concerning microdevices and their fabrication can be found in the following three books which are hereby incorporated herein by reference as if set forth in full herein:

1. Multiple authors, The MEMS Handbook, edited by Mohamed Gad-EI-Hak, CRC Press, 2002.
2. M. Madou, Fundamentals of Microfabrication, CRC Press, 2002.
3. Multiple authors, Micromechanics and MEMS, edited by William Trimmer, IEEE Press, 1997.

Various other embodiments of the present invention exist. Some of these embodiments may be based on a combination of the teachings herein with various teachings incorporated herein by reference. Some embodiments may use nickel, a nickel alloy (e.g. nickel cobalt or nickel phosphor) as a structural material while other embodiments may use different materials such as copper, gold, silver, or any other electrodepositable materials (including alloys or alloy precursors, i.e. materials that will become alloys later during the fabrication process, e.g. via heat treatment or-the like) that can be separated from the sacrificial material or materials. Some embodiments may use copper as the structural material with or without a sacrificial material. Some embodiments may remove a sacrificial material while other embodiments may not. In some embodiments, the sacrificial material may be removed by a chemical etching operation, an electrochemical operation, or a melting operation. In various embodiments, the devices produced may be used in various applications. Though in most embodiments, three dimensional structures are formed that may take on any desired three-dimensional shape (e.g. a shape having under cut regions or passages) as a result of the removal of a sacrificial material, in some embodiments, the outer configuration of structures may remain simple (e.g. a shape having a block like structure with few or no undercut or overhanging regions, passages, and the like) while an internal configuration of the structure may be complex as the result of multiple structural materials being present (e.g. in RF devices where part of the structure may be formed from a conductive material while another part of the structure may be formed from a sacrificial material.

In view of the teachings herein, many further embodiments, alternatives in design and uses of the instant invention will be apparent to those of skill in the art. As such, it is not intended that the invention be limited to the particular illustrative embodiments, alternatives, and uses described above but instead that it be solely limited by the claims presented hereafter.

We claim:

1. A method for forming at least a portion of a three-dimensional device having a desired configuration, comprising:
    a. forming at least first and second portions of a structure from a plurality of adhered layers of at least one structural material where the first portion has a first surface and the second portion has a second surface where the first and second surfaces are separated from one another during formation of the layers but which are to be located in contact or in proximity to one another in the desired configuration;
    b. separating the structure from any sacrificial material that would hinder the bringing of the first and second portions into contact or into proximity or which would be effectively trapped if in place when the first and second portions are brought together; and
    c. rotating at least one of the first and second portions relative to the other to bring the first and second surfaces into contact or into proximity to yield the three-dimensional device,
    wherein the forming comprises depositing at least one of the at least one structural material or the sacrificial material selectively onto a substrate or previously deposited material via one or more openings in a masking material that is adhered to the substrate or previously deposited material.

2. The method of claim 1 wherein the method additionally comprises:
    d. after moving the first and second portions into contact or proximity, securing the portions to yield the desired configuration.

3. The method of claim 2 wherein the securing comprises at least one of bonding with solder, bonding with a eutectic material, bonding with gold, encapsulating at least a portion of the first and second portions with a dielectric encapsulant, or engaging one or more locking clips.

4. The method of claim 1 wherein the forming results in said first and second portions being attached to one another by a bendable hinge structure.

5. The method of claim 4 wherein the hinge structure comprises a plurality of hinge structures.

6. The method of claim 4 wherein, the hinge structure comprises a configuration having at least one wider region and at least one narrower region wherein bending preferentially occurs in the narrower region.

7. The method of claim 1 wherein the forming results in said first and second portions being joined to one another by a pivotable hinge structure.

8. The method of claim 1 wherein at least one of the first portion or the second portion includes alignment structures which aid in guiding the first and second surfaces in proximity or in contact.

9. The method of claim 1 wherein at least one of the first portion or the second portion includes alignment structures which aid in ensuring that the first and second portions are properly located after moving.

10. A method for forming at least a portion of a three-dimensional device having a desired configuration, comprising:
    a. forming at least first and second portions of a structure from a plurality of adhered layers of at least one structural material where the first portion has a first surface and the second portion has a second surface where the first and second surfaces are separated from one another during formation of the layers but which are to be located in contact or in proximity to one another in the desired configuration; and
    b. rotating at least one of the first and second portions relative to the other to bring the first and second surfaces into contact or into proximity,
    wherein the forming comprises depositing at least one material selectively onto a substrate or previously deposited material via one or more openings in a masking material that is adhered to the substrate or previously deposited material, and
    wherein the forming comprises forming one or more alignment structures which aid in locating the first and second surfaces in proximity or in contact and/or which aid in guiding the first and second surfaces in proximity or in contact.

11. The method of claim 10 wherein the method additionally comprises:
    c. after moving the first and second portions into contact or proximity, securing the portions to yield the desired configuration.

12. The method of claim 11 wherein the securing comprises at least one of bonding with solder, bonding with a eutectic material, bonding with gold, encapsulating at least a portion of the first and second portions with a dielectric encapsulant, or engaging one or more locking clips.

13. The method of claim 10 wherein, the forming results in said first and second portions being attached to one another by a bendable hinge structure.

14. The method of claim 3 wherein the hinge structure comprises a plurality of hinge structures.

15. The method of claim 14 wherein the hinge structure comprises a configuration having at least one wider region and at least one narrower region wherein bending preferentially occurs in the narrower region.

16. The method of claim 10 wherein the forming results in said first and second portions being joined to one another by a pivotable hinge structure.

17. The method of claim 10 wherein the alignment structure comprises a plurality of structures which include at least one structure which is bent from a formed position to an alignment guiding position.

18. A method for forming at least a portion of a three-dimensional device having a desired configuration, comprising:
  a. forming at least first, second, and third portions of a structure from a plurality of adhered layers of at least one structural material where the first portion has a first surface and the second portion has a second surface and the third portion has a third surface, where the first, second, surfaces are separated from one another during formation of the layers but which are to be located in contact or in proximity to one another in the desired configuration, and where the third surface is separated from the first and second portions during formation but is to be located in contact or in proximity to a surface of one of the first or second portions; and
  b. moving at least one of the first and second portions relative to the other to bring the first and second surfaces into contact or into proximity,
  c. moving at least one of the third or combined first and second portions relative to the other to bring the third and combined first and second portions into contact or into proximity, wherein at least one of the moving steps comprises rotating.

* * * * *